(12) United States Patent
Thelander et al.

(10) Patent No.: US 7,826,336 B2
(45) Date of Patent: Nov. 2, 2010

(54) DATA STORAGE NANOSTRUCTURES

(75) Inventors: Claes Thelander, Lund (SE); Lars Samuelson, Lund (SE)

(73) Assignee: QuNano AB, Lund (SE)

( * ) Notice: Subject to any disclaimer, the term of this patent is extended or adjusted under 35 U.S.C. 154(b) by 1021 days.

(21) Appl. No.: 11/359,410

(22) Filed: Feb. 23, 2006

(65) Prior Publication Data
US 2007/0206488 A1 Sep. 6, 2007

(51) Int. Cl.
G11B 5/00 (2006.01)
(52) U.S. Cl. .................... 369/283; 369/272.1; 369/288; 977/943; 977/902
(58) Field of Classification Search ............. 369/272.1, 369/283, 288; 977/943, 902
See application file for complete search history.

(56) References Cited

U.S. PATENT DOCUMENTS

| 5,196,396 | A | 3/1993 | Lieber |
| 5,252,835 | A | 10/1993 | Lieber et al. |
| 5,332,910 | A | 7/1994 | Haraguchi et al. |
| 5,362,972 | A | 11/1994 | Yazawa et al. |
| 5,381,753 | A | 1/1995 | Okajima et al. |
| 5,544,617 | A | 8/1996 | Terui et al. |
| 5,840,435 | A | 11/1998 | Lieber et al. |
| 5,858,862 | A | 1/1999 | Westwater et al. |
| 5,897,945 | A | 4/1999 | Lieber et al. |
| 5,899,734 | A | 5/1999 | Lee |
| 5,976,957 | A | 11/1999 | Westwater et al. |
| 5,997,832 | A | 12/1999 | Lieber et al. |
| 6,130,142 | A | 10/2000 | Westwater et al. |
| 6,130,143 | A | 10/2000 | Westwater et al. |
| 6,159,742 | A | 12/2000 | Lieber et al. |
| 6,190,634 | B1 | 2/2001 | Lieber et al. |
| 6,286,226 | B1 | 9/2001 | Jin |
| 6,307,241 | B1 | 10/2001 | Awschalom et al. |
| 6,322,713 | B1 | 11/2001 | Choi et al. |
| 6,340,822 | B1 | 1/2002 | Brown et al. |

(Continued)

FOREIGN PATENT DOCUMENTS

EP 0 443 920 8/1991

(Continued)

OTHER PUBLICATIONS

U.S. Appl. No. 10/613,071, filed Jul. 7, 2003, Samuelson et al.

(Continued)

Primary Examiner—Robert M Kunemund
Assistant Examiner—Matthew J Song
(74) Attorney, Agent, or Firm—The Marbury Law Group PLLC

(57) ABSTRACT

The present invention relates to a device for data storage. In particular the invention relates to a single electron memory device utilizing multiple tunnel junctions, and arrays or matrixes of such devices. The data storage device according to the invention comprises at least one nanowhisker adapted to store a charge. Each of the nanowhiskers comprises a sequence of axial segments of materials of different band gaps, arranged to provide a sequence of conductive islands separated by tunnel barriers and a storage island arranged at one end of the conductive island/tunnel barrier sequence, whereby to provide a data storage capability. The number of conductive islands should preferably be between five and ten.

12 Claims, 5 Drawing Sheets

U.S. PATENT DOCUMENTS

| | | | |
|---|---|---|---|
| 6,455,340 | B1 | 9/2002 | Chua et al. |
| 6,559,468 | B1 | 5/2003 | Kuekes et al. |
| 6,586,965 | B2 | 7/2003 | Kuekes |
| 6,716,409 | B2 | 4/2004 | Hafner et al. |
| 6,743,408 | B2 | 6/2004 | Lieber et al. |
| 7,014,737 | B2 | 3/2006 | Harutyunyan et al. |
| 7,208,094 | B2 | 4/2007 | Islam et al. |
| 7,223,444 | B2 | 5/2007 | Deppert et al. |
| 7,335,908 | B2 | 2/2008 | Samuelson et al. |
| 7,354,850 | B2 | 4/2008 | Seifert et al. |
| 2002/0129761 | A1 | 9/2002 | Takami |
| 2002/0130311 | A1 | 9/2002 | Lieber et al. |
| 2002/0172820 | A1 | 11/2002 | Majumdar et al. |
| 2002/0175408 | A1 | 11/2002 | Majumdar et al. |
| 2003/0089899 | A1 | 5/2003 | Lieber et al. |
| 2003/0121764 | A1 | 7/2003 | Yang et al. |
| 2003/0200521 | A1 | 10/2003 | DeHon et al. |
| 2004/0075464 | A1* | 4/2004 | Samuelson et al. ............ 326/37 |
| 2004/0213307 | A1 | 10/2004 | Lieber et al. |
| 2004/0240252 | A1* | 12/2004 | Pinkerton et al. ........... 365/151 |
| 2004/0252737 | A1 | 12/2004 | Yi et al. |
| 2005/0006673 | A1 | 1/2005 | Samuelson et al. |
| 2005/0011431 | A1 | 1/2005 | Samuelson et al. |
| 2005/0017171 | A1* | 1/2005 | Samuelson et al. .......... 250/306 |
| 2005/0161662 | A1 | 7/2005 | Majumdar et al. |
| 2005/0199886 | A1 | 9/2005 | Yi et al. |
| 2006/0057360 | A1 | 3/2006 | Samuelson |
| 2006/0125056 | A1 | 6/2006 | Samuelson et al. |
| 2006/0189018 | A1 | 8/2006 | Yi et al. |
| 2007/0206488 | A1 | 9/2007 | Thelander et al. |

FOREIGN PATENT DOCUMENTS

| | | |
|---|---|---|
| EP | 0 838 865 | 4/1998 |
| EP | 0 544 408 B1 | 1/2000 |
| EP | 1 221 722 A1 | 7/2002 |
| EP | 1 314 189 | 5/2003 |
| EP | 1 342 075 | 9/2003 |
| JP | 2000-068493 | 3/2000 |
| WO | WO 95/02709 | 1/1995 |
| WO | WO 97/31139 | 8/1997 |
| WO | WO 01/03208 | 1/2001 |
| WO | WO 01/77726 | 10/2001 |
| WO | WO 01/84238 | 11/2001 |
| WO | WO 02/01648 | 1/2002 |
| WO | WO 02/17362 A2 | 2/2002 |
| WO | WO 02/48701 A2 | 6/2002 |
| WO | WO 02/080280 | 10/2002 |
| WO | WO 02/095883 A2 | 11/2002 |
| WO | WO 03/005450 | 1/2003 |
| WO | WO 03/053851 | 7/2003 |
| WO | WO 03/063208 | 7/2003 |
| WO | WO 2004/010552 | 1/2004 |
| WO | WO 2004/038767 | 5/2004 |

OTHER PUBLICATIONS

U.S. Appl. No. 11/812,225, filed Jun. 15, 2007, Samuelson et al.
U.S. Appl. No. 11/812,226, filed Jun. 15, 2007, Samuelson et al.
U.S. Appl. No. 11/868,122, filed Oct. 5, 2007, Samuelson et al.
U.S. Appl. No. 11/922,242, filed Jun. 16, 2006, Wernersson et al.
U.S. Appl. No. 11/922,243, filed Jun. 16, 2006, Wernersson et al.
U.S. Appl. No. 12/003,738, filed Dec. 31, 2007, Samuelson et al.
U.S. Appl. No. 12/003,739, filed Dec. 31, 2007, Samuelson et al.
U.S. Appl. No. 12/003,740, filed Dec. 31, 2007, Samuelson et al.
U.S. Appl. No. 12/003,741, filed Dec. 31, 2007, Samuelson et al.
U.S. Appl. No. 12/003,988, filed Jan. 4, 2008, Seifert et al.
Yazawa, M. et al, "Heteroepitaxial Ultrafine Wire-Like Growth of InAs on GaAs Substrates", *Applied Physics Letters*, Mar. 11, 1991, pp. 1080-1082, vol. 58, No. 10.
Haraguchi, K. et al., "GaAs p-n junction formed in quantum wire crystals", *Applied Physics Letters*, Feb. 10, 1992, pp. 745-747, vol. 60, No. 6.
Yazawa, M., et al., "Effect of one monolayer of surface gold atoms on the epitaxial growth of InAs nanowhiskers", *Applied Physics Letters*, Oct. 26, 1992, pp. 2051-2053, vol. 61.
Yazawa, M., "Nanocolumns composed of GaAs—InAs jointed whiskers and Si02 covers", *Applied Physics Letters*, Aug. 29, 1994, pp. 1157-1158, vol. 65.
Sato, T., "Site-controlled growth of nanowhiskers", *Applied Physics Letters*, Jan. 9, 1995, pp. 159-161, vol. 66.
Hiruma, K., et al., "Growth and optical properties of nanometerscale GaAs and InAs whiskers", *Applied Physics Review*, Jan. 15, 1995, pp. 447-462, vol. 77.
Hiruma, K., et al., "Growth and Characterization of Nanometer-Scale GaAs, AiGaAs and GaAs/InAs Wires", *IEICE Trans. Electron.*, Sep. 1, 1994, pp. 1420-1425, vol. E77-C, No. 9.
Hiruma, K., et al., "Gas free-standing quantum-size wires", *Journal of Applied Physics*, Sep. 1, 1993, pp. 3162-3171, vol. 74.
Haraguchi, K., et al., "Polarization dependence of light emitted from GaAs p-n junctions in quantum wire crystals", *Journal of Applied Physics*, Apr. 15, 1994, pp. 4220-4225, vol. 75.
Hiruma, K., et al., Self-organized growth of GaAs/InAs heterostructure nanocylinders by organometallic vapor phase epitaxy, *Journal of Crystal Growth*, Jan. 1, 1996, pp. 226-231, vol. 163.
Lieber, C., "Nanowires as Building Blocks for Nanoscale Science and Technology", *Abstracts of Papers of the Amer. Chem Soc.*, Aug. 18, 2002, pp. 033-Camp Part 1, vol. 224.
Duan, X. et al., "Laser Assisted Catalytic Growth of Single-Crystal Compound Semiconductor Nanowires", *Abstracts of Papers of- the Amer. Chem. Soc.*, Mar. 26, 2000, pp. 676-Inor Part 1, vol. 219.
Duan, X. et al., "Laser Assisted Catalytic Growth of Semiconductor Nanowires for Nanoscale Electronic Optoelectronic Device Application", *Abstracts of Papers of- the Amer. Chem. Soc.*, Apr. 1, 2001, pp. 644-Inor Part 1, vol. 221.
Lieber, C., "Semiconductor Nanowires: Building Blocks for Nanoscale Science and Technology", *Abstracts of Papers of- the Amer. Chem. Soc.*, Aug. 1, 2001, pp. 383-Phys Part 2, vol. 222.
Huang, Y., et al., "Integrated Optoelectronics Assembled from Semiconductor Nanowires", *Abstracts of Papers of- the Amer. Chem. Soc.*, Aug. 18, 2002, pp. 039-Phys Part 2, vol. 224.
Hu, J. et al., "Chemistry and Physics in One Dimension: Synthesis and Properties of Nanowires and Nanotubes", *Acc. Chem. Res.*, Feb. 20, 1999, pp. 435-445, vol. 32, No. 5.
Duan, X. et al., "General Synthesis of Compound Semiconductor Nanowires", *Advanced Materials*, Jan. 1, 2000, pp. 298-302, vol. 12, No. 4.
Duan, X., et al., "Synthesis and optical properties of gallium arsenide nanowires", *Applied Physics Letters*, Feb. 28, 2000, pp. 1116-1118, vol. 76, No. 9.
Cui, Y., et al., "Diameter-controlled synthesis of single-crystal silicon nanowires", *Applied Physics Letters*, Apr. 9, 2001, pp. 2214-2216, vol. 78, No. 15.
Gudiksen, M.S., et al., "Diameter-selective synthesis of semiconductor nanowires", *J. Am. Chem. Soc.*, Aug. 22, 2000, pp. 8801-8802, vol. 122.
Gudiksen, M.S., et al., "Size-Dependent Photoluminescence from Single Indium Phosphide Nanowires", *Journal of Physical Chemistry B*, Mar. 30, 2002, pp. 4036-4039, vol. 106, No. 16.
Duan, X., et al., "Laser-Assisted Catalytic Growth of Single Crystal GaN Nanowires", *Journal of Amer. Chem. Soc.*, Dec. 18, 1999, pp. 188-189, vol. 122, No. 1.
Huang, Y., et al., "Gallium Nitride Nanowire Nanodevices", *Nano Letters*, Jan. 11, 2002, pp. 81-82, vol. 2, No. 2.
Lieber, C., "Nanowire Sugerlattices", *Nano Letters*, Jan. 25, 2002, pp. 82-82, vol. 2, No. 2.
Duan, X., et al., "Nonvolatile Memory and Programmable Logic from Molecule-Gated Nanowires", *Nano Letters*, May 1, 2002, pp. 487-490, vol. 2, No. 5.
Cui, Y., et al., "High Performance Silicon Nanowire Field Effect Transistors", *Nano Letters*, Jan. 1, 2003, pp. 149-152, vol. 3, No. 2.

Zhong, Z., et al., "Synthesis of P-Type Gallium Nitride Nanowires for Electronic and Photonic Nanodevices", *Nano Letters*, Feb. 20, 2003, pp. 343-346, vol. 3, No. 3.

Hu, J., et al., "Controlled Growth and Electrical Properties of Heterojunctions of Carbon Nanotubes and Silicon Nanowires", *Nature*, May 6, 1999, pp. 48-51, vol. 399.

Duan, X., et al., "Indium phosphide nanowires as building blocks for nanoscale electronic and optoelectronic devices", *Nature*, Jan. 4, 2001, pp. 66-69, vol. 409.

Gudiksen, M.S., et al., "Growth of nanawire superlattice structures for nanoscale photonics and electronics", *Nature*, Feb. 7, 2002, , pp. 617-620, vol. 415.

Lauhon, L., et al., "Epitaxial Core-Shell and Core-Multishell Nanowire Heterostructures", *Nature*, Nov. 7, 2002, pp. 57-61, vol. 420, No. 6911.

Duan, X., "Single-nanowire electrically driven lasers", *Nature*, Jan. 16, 2003, pp. 241-244, vol. 421.

Lieber, C., "The incredible shrinking circuit", *Sci. Am.*, Sep. 1, 2001, pp. 58-64, vol. 285.

Morales, A., et al., "A Laser Ablation Method for the Synthesis of Crystalline Semiconductor Nanowires", *Science*, Jan. 9, 1998, pp. 208-211, vol. 279.

Cui, Y., et al., "Functional Nanoscale Electronic Devices Assembled Using Silicon Nanowire Building Blocks", *Science*, Feb. 2, 2001, pp. 851-853, vol. 291.

Wang, J., et al., "Highly Polarized Photoluminesence and Photodetection from Single Indium Phosphide Nanowires", *Science*, Aug. 24, 2001, pp. 1455-1457, vol. 293, No. 5534.

Cui, Y., et al., "Nanowire nanosensors for highly sensitive and selective detection of biological and chemical species", *Science*, Aug. 17, 2001, pp. 1289-1292, vol. 293.

Huang, Y., et al., "Logic Gates and Computation from Assembled Nanowire Building Blocks", *Science*, Nov. 9, 2001, pp. 1313-1317, vol. 294.

Cui, Y., et al., "Doping and Electrical Transport in Silicon Nanowires", *The Journal of Physical Chemistry B*, May 11, 2000, pp. 5213-5216, vol. 104, No. 22.

Gudiksen, M.S., et al., "Synthetic Control of the Diameter and Length of Single Crystal Semiconductor Nanowires", *The Journal of Physical Chemistry B*, Apr. 18, 2001, pp. 4062-4064, vol. 105.

Morales, A., et al., "Rational Synthesis of Silicon Nanowires", *INOR*, 651, Jan. 1, 2001.

Wong, E., et al., "Nanobeam Mechanics: Elasticity, Strength, and Toughness of Nanorods and Nanotubes", *Science*, Sep. 26, 1997, pp. 1971-1975, vol. 277.

Dai, H., et al., "Synthesis and Characterization of Carbide Nanorods", *Nature*, Jun. 29, 1995, pp. 769-772, vol. 375.

Junno, T., et al., "Controlled manipulation of nanogarticles with an atomic force microscope", *Applied Physics Letters*, Jun. 26, 1995, pp. 3627-3629, vol. 66.

Zwiller, V., et al., "Single quantum dots emit single photons at a time: Antibunching experiment", *Applied Physics Letters*, Apr. 23, 2001, pp. 2476-2478, vol. 78, No. 17.

Borgstrom, M., et al., "High peak-to-valley ratios observed in InAs/InP resonant tunneling quantum dot stacks", *Applied Physics Letters*, May 21, 2001, pp. 3232-3234, vol. 78, No. 21.

Thelander, et al., "Gold manoparticle single-electron transistor with carbon nanotube leads", *Applied Physics Letters*, Sep. 24, 2001, pp. 2106-2108, vol. 79, No. 13.

Ohlsson, B.J., et al., "Size-, shape-, and position-controlled GaAs nono-whiskers", *Applied Physics Letters*, Nov. 12, 2001, pp. 3335-3337, vol. 79, No. 20.

Bjork, M.T., et al., :One-dimensional heterostructures in semiconductor nanowhiskers, *Applied Physics Letters*, Feb. 11, 2002, pp. 1058-1060, vol. 80, No. 6.

Persson, M.P. et al., "Electronic Structure of Nanometer-Scale GaAs Whiskers", *Applied Physics Letters*, Aug. 12, 2002, pp. 1309-1311, vol. 81, No. 7.

Thelander, C., et al., "Single-Electron Transistors in Heterostructure Nanowires", *Applied Physics Letters*, Sep. 8, 2003, pp. 2052-2054, vol. 83, No. 10.

Panev, N., et al., "Sharp Exciton Emission From Single InAs Quantum Dots in GaAs Nanowires", *Applied Physics Letters*, Sep. 15, 2003, pp. 2238-2240, vol. 83, No. 11.

Bjork, M.T., "Nanowire resonant tunelling diodes", *Applied Physics Letters*, Dec. 2, 2002, pp. 4458-4460, vol. 81, No. 23.

Persson, A., "Oriented Growth of InAs-based Nanowhiskers", *Diploma Work, Lund Institute of Technology, Lund University*, May 29, 2001, pp. 1-48.

Ohlsson, J., "Semiconductor Hetero- and Nanostructures", *Doctoral Thesis, Lund Institute of Technology, Lund University*, Nov. 23, 2001.

Thelander, C., "Quantum Devices from the Assembly of Zero-and One-Dimensional Building Blocks", *Doctoral Thesis, Lund University*, Nov. 7, 2003.

Ohlsson, B., et al., "Anisotropic GaAs island phase grown on flat Gap: A stranski-Krastanow-formed corrugated surface", *Journal of Applied Physics*, May 15, 2001, pp. 5726-5730, vol. 89, No. 10.

Magnusson, M., et al.,"Gold nanogarticles: Production, reshaping, and thermal charging", *Journal of Nanoparticle Research*, Jan. 1, 1999, pp. 243-251, vol. 1.

Samuelson, L., "Self-Forming Nanoscale Devices", *Materials Today*, Oct. 22, 2003, pp. 22-31.

Ohlsson, B., et al., "Fabrication and characterization of III-V nanowhiskers", *MSS10 Conference—Austria*, Jul. 23-27, 2001.

Bjork, M.T., et al., "One-dimensional Steeplechase for Electrons Realized", *Nano Letters*, Jan. 19, 2002, pp. 87-89, vol. 2, No. 2.

Martensson, T., et al., "Fabrication of Individually Seeded Nanowire Arrays by Vapour-Liquid-Solid Growth", *Nanotechnology*, Oct. 17, 2003, pp. 1255-1258, No. 14.

Burgess, D.S., "Nanowire Heterostructures Form Tunneling Diodes", *Photonics Spectra*, pp. 3-5, vol. 37, No. 2, 2002 MS.

Pettersson, H., et al., "Electrical and Optical Properties of Self-Assembled InAs Quantum Dots in InP Studied by Space-Charge Spectroscopy and Photoluminescence", *Phys. Rev. B*, Feb. 15, 2000, pp. 4795-4800, vol. 61, No. 7.

Ohlsson, B.J., et al., "Growth and characterization of GaAs and InAs nano-whiskers and InAs/GaAs heterostructures", *Physica E*, Mar. 1, 2002, pp. 1126-1130, No. 13.

Samuelson, L., et al., "Tunnel-Induced Photon Emission in Semiconductors Using an STM", *Physica Scripta*, Jan. 1, 1992, pp. 149-152, vol. T42.

Seifert, W. et al, "In-Situ Growth of Quantum Dot Structures by the Stranski-Krastanow Growth Mode", *Prog. Crys. Growth Charact.*, Jan. 1, 1996, pp. 423-471, vol. 33.

Persson, M., "Tight-Binding Simulation of Nanocrystalline Particles and Whiskers", *Tekn lic thesis, Lund University*, Aug. 1, 2002.

Bjork, M., "Semiconductor Nanowires and Devices", *Tekn lic thesis, Lund University*, Nov. 1, 2002.

Murphy, C.J., et al., "Controlling the Aspect Ratio of Inorganic Nanorods and Nanawires", *Advanced Materials*, Jan. 4, 2002, pp. 80-82, vol. 14, No. 1.

Wagner, R.S., et al., "Vapour-Liquid-Solid Mechanism of Single Crystal Growth", *Applied Physics Letters*, Mar. 1, 1964, pp. 89-90, vol. 4, No. 5.

Canham, L.T., "Silicon Quantum Wire Array Fabrication by Electrochemical and Chemical Dissolution of Wafers", *Applied Physics Letters*, Sep. 3, 1990, pp. 1046-1048, vol. 57.

Koga, T., et al., "Carrier Pocket Engineering Applied to Strained . . . ", *Applied Physics Letters*, Oct. 18, 1999, pp. 2438-2440, vol. 75.

Koga, T., et al., "Experimental Proof-of-Principle Investigation of Enhanced $Z_{3d}T$ in (001) Oriented Si/Ge Superlattices", *Applied Physics Letters*, Sep. 4, 2000, pp. 1490-1492, vol. 77, No. 10.

Narihiro, M., et al., "Resonant tunneling of electrons via 20 nm scale InAs quantum dot and magnetotunneling spectroscopy of its electronic states", *Applied Physics Letters*, Jan. 6, 1997, pp. 105-107, vol. 70, No. 1.

Pan, Z., et al., "Conduction band offset and electron effective mass in GaInNAs/GaAs quantum-well structures with low nitrogen concentration", *Applied Physics Letters*, Apr. 9, 2001, pp. 2217-2219, vol. 78, No. 15.

Ferry, D.K., et al., "Transport in Nanostructures", *Cambridge University Press*, Hardcover, Jan. 1, 1997, pp. 41-45 and 91-96.

Givargizov, E., "Growth of Whiskers by the Vapor-Liquid-Solid Mechanism", *Current Tonics in Material Science*, edited by E. Kaldis, Jan. 1, 1978, pp. 79-145, Chapter 3, vol. 1.

Mullins, J., "News analysis: using unusable frequencies", IEEE Spectrum, Jul. 1, 2002, pp. 22-23, vol. 39, No. 7.

Randall, J.N., et al., "Quantum Dot Devices", in Norman G. Einsgruch and William R. Frensley, eds., Heterostructures and Quantum Devices (San Diego, CA: Academic Pres, Inc., 1994) Copyright 1994, p. 420.

Markowitz, P.D., et al., "Phase Separation in $Al_xGa_{1-x}As$ Nanowhiskers Grown by the Solution-Liquid-Solid Mechanism", *J. Am. Chem. Soc.*, Apr. 18, 2001, pp. 4502-4511, vol. 123.

Hickmott, T.W., et al., "Negative Charge, Barrier Heights, and the Conduction-Ban Discontinuity in $Al_xGa_{1-x}As$ Capacitors", *Journal of Applied Physics*, Apr. 15, 1985, pp. 2844-2853, vol. 57.

Matthews, J., et al., "Defects in Epitaxial Multillayers", *Journal of Crystal Growth*, Jan. 1, 1974, pp. 118-125, vol. 27.

Kovtyukhova, N., et al., "Layer-by-Layer Assembly Rectifying Junctions in and on Metal Nanowires", *Journal of Physical Chemistry B*, Aug. 14, 2001, pp. 8762-8769, vol. 105.

Sakaki, H., "Scattering Suppression and High-Mobility Effect of Size-Quantized Electrons in Ultrafine Semiconductor Wire Structures", *Japanese Journal of Applied Physics*, Dec. 1, 1980, pp. L735-L738, vol. 19, No. 12.

Scheibel, H., et al., "Generation of Monodisperse Ag- and NaCl Aerosols With Particle Diameters Between 2 and 300 nm", *Journal of Aerosol Science*, Jan. 1, 1983, pp. 113-126, vol. 14, No. 2.

Knutson, E., et al., "Aerosol Classification by Electric Mobility: Apparatus, Theory, and Applications", *Journal of Aerosol Science*, Jan. 1, 1975, pp. 443-451, vol. 6.

Miller, M., et al., "Serpentine Superlattice: Concept and First Results", *Journal of Crystal Growth*, Jan. 1, 1991, pp. 323-327, vol. 111.

Bhat, R., et al., "Patterned Quantum Well Heterostructures Grown by OMCVD on Non-Planar Substrates: Applications to Extremely Narrow SQW Lasers", *Journal of Crystal Growth*, Jan. 1, 1988, pp. 850-856, vol. 93.

Hara, S., et al, "Formation and Photoldnescence Characterization of Quantum Well Wires Using Multiatdc Steps Grown by Metalorganic Vapor Phase Epitaxy", *Journal of Crystal Growth*, Jan. 1, 1994, pp. 692-697, vol. 145.

Givargizov, E.I., "Fundamental Aspects of VLS Growth", *Journal of Crystal Growth*, Jan. 1, 1975, pp. 20-30, vol. 31.

Derycke, V., et al., "Carbon Nonotube Inter- and Intramolecular Logic Gates", *Nano Letters*, Aug. 26, 2001, pp. 453-456, vol. 1, No. 9.

Iijima, S., "Helical microtubules of graphitic carbon", *Nature*, Nov. 7, 1991, pp. 56-58, vol. 354.

Yao, Z., et al., "Carbon Nanotube Intramolecular Junctions", *Nature*, Nov. 18, 1999, pp. 273-276, vol. 402.

Bennett, C., et al., "Quantum information and computation", *Nature*, Mar. 16, 2000, pp. 247-255, vol. 404.

Michler, P. et al., "Quantum correlation among photons from a single quantum dot at room temperature", *Nature*, Aug. 31, 2000, pp. 968-970, vol. 406, No. 6799.

Chow, E., et al., "Three-dimensional control of light in a two-dimensional photonic crystal slab", *Nature*, Oct. 26, 2000, pp. 983-986, vol. 407.

Venkatasubramanian, R., et al., "Thin-Film Thermoelectric Devices with High Room-Temperature Figures of Merit", *Nature*, Oct. 11, 2003, pp. 597-602, vol. 413.

Bachtold, A., et al., "Scanned probe microscopy of electronic transport in carbon nanotubes", *Phys. Rev. Lett.*, Jun. 26, 2000, pp. 6082-6085, vol. 84, No. 26.

Hicks, L.D., et al., "Thermoelectric Figure of Merit of a One-Dimensional Conductor", *Physical Review B*, Jun. 15, 1993, pp. 16631-16634, vol. 47, No. 24.

Itskevich, I.E., et al., "Resonant magnetotunneling through individual self-assembled InAs quantum dots", *Physical Review B*, Dec. 15, 1996, pp. 16401-16404, vol. 54, No. 23.

Reed, M.A., et al., "Observation of Discrete Electronic States in a Zero-Dimensional Semiconductor Nanostructure", *Physical Review Letters*, Feb. 8, 1988, pp. 535-537, vol. 60, No. 6.

Kapon, E., et al., "Stimulated Emission in Semiconductor Quantum Wire Heterostructures", *Physical Review Letters*, Jul. 24, 1989, pp. 430-433, vol. 63, No. 4.

Santori, C., et al., "Triggered Single Photons from a Quantum Dot", *Physical Review Letters*, Feb. 19, 2001, pp. 1502-1505, vol. 86, No. 8.

Capasso, F., et al., "Quantum Cascade Lasers", *Physics Today*, May 1, 2002, pp. 34-40.

Likharev, K.K., "Single-Electron Devices and their Applications", *Proceedings of the IEEE*, Apr. 1, 1999, pp. 606-632, vol. 87, No. 4.

Han, W., et al., "Synthesis of Gallium Nitride Nanorods Throuah a Carbon Nanotube-Confined Reaction", *Science*, Aug. 29, 1997, pp. 1287-1289, vol. 277.

Zhang, Y., et al., "Heterostructures of Single-Walled Carbon Nanotubes and Carbide Nanorods", *Science*, Sep. 10, 1999, pp. 1719-1722, vol. 285.

Holmes, J., et al., "Control of Thickness and Orientation of Solution-Grown Silicon Nanowires", *Science*, Feb. 25, 2000, pp. 1471-1473, vol. 287.

Zhou, C.W., et al., "Modulated chemical doping of individual carbon nanotubes", *Science*, Nov. 24, 2000, pp. 1552-1555, vol. 290.

Favier, F., et al., "Hydrogen Sensors and Switches from Electrodeposited Palladium Mesowire Arrays", *Science*, Sep. 21, 2001, pp. 2227-2231, vol. 293.

Bachtold, A., et al., "Logic circuits with carbon nanotube transistors", *Science*, Nov. 9, 2001, pp. 1317-1320, vol. 294.

Nicewarner-Pena, S.R., et al., "Submicrometer metallic barcodes", *Science*, Oct. 5, 2001, pp. 137-141, vol. 294.

Service, R.F., "Nanowire Fabricators Earn Their Stripes", *Science*, Jan. 1, 2002, pp. 946-947, vol. 295, No. 5557.

Awschalom, D.D. et al., "Spintronics", *Scientific American*, Jun. 1, 2002, pp. 66-73, vol. 286, No. 6.

Henning, P., et al., "Compositional information from amorphous Si-Ge multilayers using high-resolution electron microscopy imaging and direct digital recording", *Ultramicroscopy*, Jan. 1, 1996, pp. 221-235, vol. 66.

Wagner, R.S., "VLS Mechanism of Crystal Growth", *Whisker Technology*, A.P. Levitt, ed., Chapter 3, Jan. 1, 1970, pp. 47-119.

Alferov, Z., et al., "For developing semiconductor heterostructures used in high-speed-and opto-electronics", Nov. 23, 2000, www.nobel.se.physics/laureates/2000/.

Von Klitzing, K., "for the discovery of the quantized Hall effect", Jun. 16, 2000, www.nobel.se/physics/laureates/1985/.

Laughlin, R.B., et al., "For their discovery of a new form of quantum fluid with frictionally charged excitations", Jun. 16, 2000, www.nobel.se/physics/laureates/1998/.

Oda, Y., et al., "Natural Formation of Square Scale Structures on Patterned Vicinal Substrates by MOVPE: Application to the Fabrication of Quantum Structures", *Phys. Conf. Ser.*, No. 166, Chapter 4, Aug. 22-26, 1999, pp. 191-194.

Hayakawa, K., et al., "AlGaAs Nano-Meter Scale Network Structures Fabricated by Selective Area MOVPE", *Phys. Conf. Ser.*, No. 162, Chapter 8, Oct. 12-16, 1998.

Akabori, M., et al., "Selective Area MOVPE Growth of Two-Dimensional Photonic Crystals Having an Air-Hole Array and its Application to Air-Bridge-Type structure", *Physica E*, No. 13, Jan. 1, 2002, pp. 446-450.

Melechko, A.V., et al., "Large-Scale Synthesis of Arrays of High-Aspect-Ratio Rigid Vertically Aligned Carbon Nanofibres", *Nanotechnology*, No. 14, Aug. 19, 2003, pp. 1029-1035.

Kempa, K., et al., "Photonic Crystals Based on Periodic Arrays of Aligned Carbon Nanotubes", *Nano Letters*, Nov. 19, 2002, pp. 13-18, vol. 3, No. 1.

Takahashi, H., et al., "Formation and Characteristics of 100 nm Scale GaAs Quantum Wires by Selective Area MOVPE", *Applied Surface Science*, No. 216, Jan. 1, 2003, pp. 402-406.

Akabori, M., et al., "InGaAs Nano-Pillar Array Formation on Partially Masked InP(111)B by Selective Area Metal-Organic Vapour Phase Egitaxial Growth for Two-Dimensional Photonic Crystal Application", *Nanotechnology*, No. 14, Aug. 27, 2003, pp. 1071-1074.

Kamins, T.I., et al., "Self-Assembled Silicon Nanowires for Integrating Microsystems, Nanoelectronics and Microelectronics", *mstnews*, 3/03, Mar. 1, 2003.

Wu, Y., et al., "Rational Synthesis of Inorganic Nanowires", *Abstracts of Papers in the Amer. Chem. Soc.*, Apr. 1, 2001, pp. 108-Iec Part 1, vol. 221.

Yang, P., et al., "Nanowires from Vapor Condensation and their Assemblies", *Abstracts of Papers in the Amer. Chem. Soc.*, Mar. 26, 2000, pp. 269-Inor Part 1, vol. 219.

Huang, M., et al., "Nanowire Array as Potential 2-d Photonic Bandgap Materials", *Abstracts of Paners in the Amer. Chem. Soc.*, Apr. 1, 2001, pp. 95-Phys Part 2, vol. 221.

Yang, P., et al., "Inorganic Nanowires: Rational Synthesis, Functional Assemblies and Novel Properties", *Abstracts of Papers in the Amer. Chem. Soc.*, Apr. 7, 2002, pp. 343-Inor Part 2, vol. 223.

Gates, B., et al., "Synthesis and Characterization of Crystalline Ag2Se Nanowires through a Template-Engaged Reaction at Room Temperature", *Advanced Fun. Materials*, Oct. 1, 2002, pp. 679-686, vol. 12, No. 10.

Yang, P., et al., "Controlled Growth of ZnO Nanowires and their Optical Properties", *Advanced Functional Materials*, May 2002, pp. 323-331, vol. 12, No. 5.

Wu, Y., et al., "Superconducting MgB2 Nanowires", *Advanced Materials*, Oct. 2, 2001, pp. 1487-1489, vol. 13, No. 19.

Huang, M., et al., "Catalytic Growth of Zinc Oxide Nanowires by Vapor Transport", *Advanced Materials*, Jan. 16, 2001, pp. 113-116, vol. 13, No. 2.

Wu, Y., et al., "Melting and Welding Semiconductor Nanowires in Nanotubes", *Advanced Materials*, Apr. 4, 2001, pp. 520-523, vol. 13, No. 7.

Zheng, B., et al., "Synthesis of Ultra-Long and Highly Oriented Silicon Oxide Nanowires from Liquid Alloys", *Advanced Materials*, Jan. 16, 2002, pp. 122-124, vol. 14, No. 2.

Kind, H., et al., "Nanowire Ultraviolet Photodetectors and Optical Switches", *Advanced Materials*, Jan. 16, 2002, pp. 158-160, vol. 14, No. 2.

Xia, Y., et al., "Chemistry and Physics of Nanowires", *Advanced Materials*, Mar. 4, 2003, pp. 351-352, vol. 15, No. 5.

Xia, Y., et al., "One-Dimensional Nanostructures: Synthesis, Characterization, and Applications", *Advanced Materials*, Mar. 4, 2003, pp. 353-389, vol. 15, No. 5.

Yan, H., et al., Morphogensis of One-Dimensional ZnO Nano- and Microcrystalsm, *Advanced Materials*, Mar. 4, 2003, pp. 402-405, vol. 15, No. 5.

Wu, Y., et al., "Germanium/Carbon Core-Sheath Nanostructures", *Applied Physics Letters*, Jul. 3, 2000, pp. 43-45, vol. 77, No. 1.

Wu, Y., et al., "Inorganic Semiconductor Nanowires: Rational Growth, Assembly, and Novel Properties", *Chemistry-A European Journal*, Mar. 15, 2002, pp. 1261-1268, vol. 8, No. 6.

Yang, P., et al., "Langmuir-Blodgett Assembly of One-Dimensional Nanostructures", *Chemphyschem*, Jun. 17, 2002, pp. 503-506, vol. 3, No. 6.

Wu, Y., et al., "Direct Observation of Vapor-Liquid-Solid Nanowire Growth", *J. Am. Chem. Soc.*, Mar. 13, 2001, pp. 3165-3166, vol. 123.

Yan, H., et al., "Dendritic Nanowire Ultraviolet Laser Array", *J. Am. Chem. Soc.*, Mar. 29, 2003, pp. 4728-4729, vol. 125, No. 16.

Johnson, J., et al., "Single Nanowire Lasers", *Journal of Physical Chemistry B*, Oct. 23, 2001, pp. 11387-11390, vol. 105, No. 46.

Messer, B., et al., "Microchannel Networks for Nanowire Patterning", *Journal of the Amer. Chem. Soc.*, Sep. 29, 2000, pp. 10232-10233, vol. 122, No. 41.

Song, J., et al., "MMo3Se3 (M=Li+,Na+, Rb+,Cs+, NMe4+) Nanowire Formation via Cation Exchange in Organic Solution", *Journal of the Amer. Chem. Soc.*, Mar. 10, 2001, pp. 9714-9715, vol. 123, No. 39.

Li, Y., et al, "Bismuth Nanotubes: A Rational Low-Temperature Synthetic Route", Journal of the Amer. Chem. Soc., Sep. 14, 2001, pp. 9904-9905, vol. 123, No. 40.

Song, J., et al., "Metal Nanowire Formation Using $Mo_3Se_3{}_-$ as Reducing and Sacrificing Templates", Journal of the Amer. Chem. Soc., Sep. 26, 2001, pp. 10397-10398, vol. 123, No. 42.

Gates, B., et al., "Single-Crystalline Nanowires of Ag2Se Can Be Synthesized by Templating Against Nanowires of Trigonal Se", *Journal of the Amer. Chem. Soc.*, Oct. 25, 2001, pp. 11500-11501, vol. 123, No. 46.

Wu, Y., et al., "Block-by-Block Growth of Single-Crystalline Si/SiGe Superlattice Nanowires", *Nano Letters*, Jan. 19, 2002, pp. 83-86, vol. 2, No. 2.

Johnson, J., et al., "Near-Field Imaging of Nonlinear Optical Mixing in Single Zinc Oxide Nanowires", *Nano Letters*, Apr. 1, 2002, pp. 279-283, vol. 2, No. 4.

Johnson, J., et al., "Single Gallium Nitride Nanowire Lasers", *Nature Materials*, Sep. 15, 2002, pp. 106-110, vol. 1, No. 2.

Huang, M.H., et al., "Room-Temperature Ultraviolet Nanowire Nanolasers", *Science*, Jun. 8, 2001, pp. 1897-1899.

Wu, Y., et al., "Germanium Nanowire Growth via Sample Vapor Transport", *Chem. Mater*, Mar. 20, 2000, pp. 605-607, vol. 12.

Wu, Y., et al., "Semiconductor Nanowire Array: Potential Substrates for Photocatalysis and Photovoltaics", *Topics in Catalysis*, Apr. 1, 2002, pp. 197-202, vol. 19, No. 2.

Hiruma, K., et al., "GaAs free-standing quantum-size wires", *Journal of Applied Physics*, Sep. 1, 1993, pp. 3162-3171, vol. 74.

Liu J.L., et al., "Gas-source MBE growth of freestanding Si nanowires on Au/S1 substrate", *Superlattices Microstructures*, 1999, pp. 477-479, vol. 25, No. 1-2.

Shimada, et al., "Size, position and direction control on GaAs and InAs nanowhisker growth", *Superlattices and Microstructures*, Dec. 1998, pp. 453-458, vol. 24, No. 6.

Shirai, M., et al., "Gold cluster formation using an atomic force microscope and its applications to GaAs whisker growth", *Superlattices and Microstructures*, Aug. 1998, pp. 157-162, vol. 24, No. 2.

Hiruma, K., et al., "Gas and InAs Nanowire Growth Technology", *Proceedings of the Science and Technology of Atomically Engineered Materials*, Oct. 30, 1995, pp. 563-570.

Westwater, J., et al., "Control of the size and position of silicon nanowires grown via the vapor-liquid-solid technique", *Japanese Journal of Applied Physics*, Part 1, Oct. 1997, pp. 6204-6209, vol. 36.

O'Regan, et al., "A Low-Cost, High-Efficiency Solar Cell Based on Dye-Sensitized Colloidal TiOa Films", *Nature*, Oct. 24, 1991, pp. 737-740, vol. 353.

Jun, et al., "Architectural Control of Magnetic Semiconductor Nanocrystals", *J. Am. Checm Soc.*, Jan. 4, 2002, pp. 615-619, vol. 124, No. 4.

Manna, et al., "Synthesis of Soluble and Processable Rod-, Arrow-, Teardrop-, and Tetrapod-Shaped CdSe Nanocrystals", *J. Am. Chec. Soc.*, Dec. 1, 2000, pp. 12700-12706, vol. 122, No. 51.

Huang, et al., "Directed Assembly of one-dimensional nanostructures into functional networks", *Science*, Jan. 26, 2001, pp. 630-633, vol. 291.

Persson, "Heterointerfaces in III-V semiconductor nanowhiskers", *IEEE*, 2002, pp. 281-283.

Gao, et al., "Self-Assembled Nanowire-Nanoribbon Junction Arrays of ZnO", *The Journal of Physical Chemistry*, Nov. 12, 2002, pp. 12653-12658, vol. 106, No. 49.

Jun, et al., "Controlled Synthesis of Multi-Armed CdS Nanorod Architectures Using Monosurfactant System", *J. Am. Chem. Soc.*, May 5, 2001, pp. 5150-5151, vol. 123.

Poole, et al., "Spatially Controlled, Nanoparticle-Free Growth of InP Nanowires", *Applied Physics Letters*, Sep. 8, 2002, pp. 2055-2057, vol. 83, No. 10.

Hiruma et al., "Quantum Size Microcrystals Grown Using Organametallic Vapor Phase Epitaxy", *Appl. Phys. Lett.* vol. 59, No. 4, Jul. 22, 1991, pp. 431-433.

Ozaki et al., "Silicon Nanowhiskers Grown on a Hydrogen-Terminated Silicon (111) Surface", *Applied Physics Letters*, vol. 73, No. 25, Dec. 21, 1998, pp. 3700-3702.

Wu et al., "Growth, Branching, and Kinking of Molecular-Beam Epitaxial <110> GaAs Nanowires", *Applied Physics Letters*, vol. 83, No. 16, Oct. 20, 2003, pp. 3368-3370.

Grätzel, "Photoelectrochemical Cells", *Nature*, vol. 414, Nov. 15, 2001, pp. 338-344.

Wang et al., "Nanocrystals Branch Out", *Nature Materials*, vol. 2, Jun. 2003, pp. 385-386.

Manna et al., "Controlled Growth of Tetrapod-Branched Inorganic Nanocrystals", *Nature Materials*, vol. 2, Jun. 2003, pp. 382-385.

Wang et al., "Rational Growth of Branched and Hyperbranched Nanowire Structures", *Nano Letters*, vol. 4, No. 5, Mar. 31, 2004.

Dick et al., "Synthesis of Branched 'Nanotrees' by Controlling Seeding of Multiple Branching Events", *Nature Materials*, vol. 3, May 2, 2004.

Oda et al., "Natural Formation of Square Scale Structures on Patterned Vicinal Substrates by MOVPE: Application to the Fabrication of Quantum Structures", *Inst. Phys. Conf. Ser.*, No. 166, Chapter 4, Aug. 22, 1999, pp. 191-194.

Akabori et al., "Selective Area MOVPE Growth of Two-Dimensional Photonic Crystals Having an Air-Hole Array and its Application to Air-Bridge-Type Structures", *Physica E*, No. 13, 2002, pp. 446-450.

Melechko et al., "Large-Scale Synthesis of Arrays of High-Aspect-Ratio Ridig Vertically Aligned Carbon Nanofibres", *Nanotechnology*, No. 14, Aug. 19, 2003, pp. 1029-1035.

Wu et al., "Single-Crystal Metallic Nanowires and Metal/Semiconductor Nanowire Heterostructures", *Nature*, vol. 430, Jul. 1, 2004, pp. 61-65.

Zhong et al., "Nanowire Crossbar Arrays as Address Decoders for Integrated Nanosystems", *Science*, vol. 302, Nov. 21, 2003, pp. 1377-1379.

McAlpine et al., "High-Performance Nanowire Electronics and Photonics on Glass and Plastic Substrates", *Nano Letters*, vol. 3, No. 11, Oct. 14, 2003, pp. 1531-1535.

Greytak et al., "Growth and Transport Properties of Complementary Germanium Nanowire Field-Effect Transistors", *Applied Physics Letters*, vol. 84, No. 21, May 24, 2004, pp. 4176-4178.

Whang et al., "Large-Scale Hierarchical Organization of Nanowire Arrays for Integrated Nanosystems", *Nano Letters*, vol. 3, No. 9, Aug. 5, 2003, pp. 1255-1259.

McAlpine et al., "Nanoimprint Lithography for Hybrid Plastic Electronics", *Nano Letters*, vol. 3, No. 4, Mar. 7, 2003, pp. 443-445.

Bozovic et al., "Plastic Deformation in Mechanically Strained Single-Walled Carbon Nanotubes", *Physical Review B*, vol. 57, Jan. 22, 2003, pp. 033407-1-033407-4.

Hahm et al., "Direct Ultrasensitive Electrical Detection of DNA and DNA Sequence Variations Using Nanowire Nanosensors", *Nano Letters*, vol. 4, No. 1, Dec. 9, 2003, pp. 51-54.

Lieber, "Nanoscale Science and Technology: Building a Big Future from Small Things", MRS Bulletin, Jul. 2003, pp. 486-491.

Yu et al., "Silicon Nanowires: Preparation, Device Fabrication, and Transport Properties", *J. Phys. Chem. B.*, vol. 104, No. 50, Nov. 23, 2000, pp. 11864-11870.

Law et al., "Photochemical Sensing of $NO_2$ with $SnO_2$ Nanoribbon Nanosensors at Room Temperature", *Angew. Chem. Int. Ed.*, vol. 41, No. 13, 2002, pp. 2405-2408.

Lao et al., "Hierarchical ZnO Nanostructures", *Nano Letters*, vol. 2, Sep. 13, 2002, pp. 1287-1291.

Barrelet et al., "Synthesis of CdS and ZnS Nanowires Using Single-Source Molecular Precursors", *J. Am. Chem. Soc.*, vol. 125, 2003, pp. 11498-11499.

Björk et al., "Few-Electron Quantum Dots in Nanowires", *Nano Letters*, vol. 4, No. 9, Jul. 28, 2004, pp. 1621-1625.

Martensson et al., "Nanowire Arrays Defined by Nanoimprint Lithography", *Nano Letters*, vol. 4, Mar. 17, 2004, pp. 699-702.

Hornstra, "Dislocations in the Diamond Lattice", *J. Phys. Checm. Solids*, vol. 5, 1958, pp. 129-141.

Krost et al., "InP on Si(111): Accommodation of Lattice Mismatch and Structural Properties", *Appl. Phys. Lett.*, vol. 64, No. 7, Feb. 7, 1994, pp. 769-771.

Gorbach et al., "Growth of III-V Semiconductor Layers on Si Patterned Substrates", *Thin Solid Films*, vol. 336, 1998, pp. 63-68.

Ohlsson et al., "Anti-Domain-Free GaP, Grown in Atomically Flat (001) Si Sub-μm-sized Openings", *Applied Physics Letters*, vol. 80, No. 24, Jun. 17, 2002, pp. 4546-4548.

Kawanami, "Heteroepitaxial Technologies of III-V on Si", *Solar Energy Materials & Solar Cells*, vol. 66, 2001, pp. 479-486.

Westwater et al., "Growth of Silicon Nanowires Via Gold/Silane Vapor-Liquid-Solid Reaction", *J. Vac. Sci. Technol. B.*, vol. 15, No. 3, 1997, pp. 554-557.

Kamins et al., "Ti-Catalyzed Si Nanowjres by Chemical Vapor Deposition: Microscopy and Growth Mechanisms", *Journal of Applied Physics*, vol. 89, No. 2, Jan. 15, 2001, pp. 1008-1016.

Schubert et al., "Silicon Nanowhiskers Grown on <111> Si Substrates by Molecular-Bean Epitaxy", *Applied Physics Letters*, vol. 84, No. 24, Jun. 14, 2004, pp. 4968-4970.

Kamins et al., "Growth and Structure of Chemically Vapor Deposited Ge Nanowires on Si Substrates", *Nano Letters*, vol. 4, No. 3, Jan. 23, 2004, pp. 503-506.

Thornton et al., "A Photoemission Study of Passivated Silicon Surfaces Produced by Etching in Solutions of HF", *Semicond. Sci. Technol.*, vol. 4, 1989, pp. 847-851.

Borgstrom et al., "Size- and Shape-Controlled GaAs Nano-Whiskers Grown by MOVPE: A Growth Study", *Journal of Crystal Growth*, vol. 260, 2004, pp. 18-22.

Westwater et al., "Si Nanowires Grown Via the Vapour-Liquid-Solid Reaction", *Phys. Stat. Sol.*, vol. (a)165, 1998, pp. 37-42.

Westwater et al., "The Characteristics and Oxidation of Vapor-Liquid-Solid Grown Si Nanowires", *Mat. Res. Soc. Symp. Proc.*, vol. 452, 1997, pp. 237-242.

Westwater et al., "Nanoscale Silicon Whiskers Formed by Silane/Gold Reaction at 335° C.", *Materials Letters*, vol. 24, Jun. 1995, pp. 109-112.

Yang, "Semiconductor Nanowire Array", *Proceedings of the SPIE*, vol. 4806, 2002, pp. 222-224.

Kuykendall et al., "Crystallographic Alignment of High-Density Gallium Nitride Nanowire Arrays", *Nature Materials*, vol. 3, Jul. 25, 2004, pp. 524-528.

Abramson et al., "Fabrication and Characterization of a Nanowire/Polymer-Based Nanocomposite for a Prototype Thermoelectric Device", *Journal of Microelectromechanical Systems*, vol. 13, No. 3, Jun. 2004, pp. 505-513.

Abramson et al., "Nanowire Composite Thermoelectric Devices", *Proceedings of IMECE2002, ASME International Mechanical Engineering Congress & Exposition*, Nov. 17-22, 2002, pp. 7-11.

Johnson et al., "Single Nanowire Waveguides and Lasers", *Proceedings of SPIE*, vol. 5223, 2003, pp. 187-196.

Greene et al., "Low-Temperature Wafer-Scale Production of ZnO Nanowire Arrays", *Angew. Chem. Int. Ed.*, vol. 42, 2003, pp. 3031-3034.

Kim et al., "Nanowire Arrays for Thermoelectric Devices", *Proceedings of HT2003, ASME Summer Heat Transfer Conference*, Jul. 21-23, 2003, pp. 101-104.

Choi et al., "Self-Organized GaN Quantum Wire UV Lasers", *J. Phys. Chem. B.*, vol. 107, 2003, pp. 8721-8725.

Yang, "From Nanowire Lasers to Quantum Wire Lasers", *Proceedings of SPIE*, vol. 5349, 2004, pp. 18-23.

Mikkelsen et al., "Direct Imaging of the Atomic Structure Inside a Nanowire by Scanning Tunneling Microscopy", *Nature Materials*, vol. 3, Jul. 4, 2004, pp. 519-523.

Thelander et al., "Electron Transport in InAs Nanowires and Heterostructure Nanowire Devices", *Solid State Communications*, vol. 131, Jun. 11, 2004, pp. 573-579.

Samuelson et al., "Semiconductor Nanowires for Novel One-Dimensional Devices", *Physica E*, vol. 21, 2004, pp. 560-567.

Shorubalko et al., "Tunable Nonlinear Current-Voltage Characteristics of Three-Terminal Ballistic Nanojunctions", *Applied Physics Letters*, vol. 83, No. 12, Sep. 22, 2003, pp. 2369-2371.

Samuelson et al., "Fabrication and Spectroscopic Studies of InP/GaInAs/Inp and GaAs/GaInAs/GaAs Quantum-Well Wire Structures", *Inst. Phys. Confer. Ser.* No. 127, Chapter 3, Jan. 1, 1992, pp. 95-98.

Samuelson et al., "Fabrication and Imaging of Quantum Well Wire Structures", *SPIE*, vol. 1676, 1992, pp. 154-160.

Larsson et al., "Probing of Individual Semiconductor Nanowhiskers by TEM-STM", *Microscopy and Microanalysis*, vol. 10, 2004, pp. 41-46.

Ramvall et al., Quantized Conductance in a Heterostructurally Defined $Ga_{0-25}In_{0-75}As/InP$, *Appl. Phys. Lett.*, vol. 71, Aug. 18, 1997, pp. 918-920.

Ng et al., "Growth of Epitaxial Nanowires at the Junctions of Nanowalls", *Science*, vol. 300, May 23, 2003, p. 12.

Ng et al., "Epitaxial Single Crystalline Inorganic Nanowires and Nanowalls: Growth Morphogenesis and Applications in Nano-Optoelectronics", *Proceedings of SPIE*, vol. 5349, 2004, pp. 11-17.

Ng et al., "Three Dimensional Columnar Optical Nanostructures Fabricated by Using Lithography-Free Templating Approach", *Applied Physics Letters*, vol. 84, No. 15, Apr. 12, 2004, pp. 2898-2900.

Thelander et al., "One Dimensional Heterostructures and Resonant Tunneling in III-V Nanowires", *IEEE International Symposium on Compound Semiconductors*, Aug. 25, 2003, pp. 151-152.

Björk et al., "Heterostructures in One-Dimensional Nanowires", *Proceedings of 7th International Conference of Nanometer-Scale Science and Technology and 21st European Conference on Surface Science*, Jun. 24, 2002.

Ohlsson et al., "Comparison Between (111)B and (100)III-V Nanowhiskers", Proceedings of 7th International Conference of Nanometer-Scale Science and 21st European Conference on Surface Science, Jun. 24, 2002.

Larsson et al, In-Situ Manipulations and Electrical Measurements of III-V Nanowhiskers with TEM-STM, Proceedings of 7th International Conference of Nanometer-Scale Science and Technology and 21st European Conference on Surface Science, Jun. 24, 2002.

Persson et al., "Solid-phase-diffusion mechanism for GaAs nanowire growth", *Nature Materials*, vol. 3, Oct. 2004, pp. 677-681.

Ng et al., "Single Crystal Nanowire Vertical Surround-Gate-Field-Effect Transistor", *Nano Letters*, vol. 4, No. 7, May 29, 2004, pp. 1247-1252.

Lieber et al., "Nanowires as Building Blocks for Nanoelectronics and Nanophotonics", *Electron Devices Meeting 2003 IEEE International*, 2003, pp. 12.3.1-12.3.3.

Martensson et al., "Epitaxial-III-V Nanowires on Silicon", *Nano Letters*, vol. 4, No. 10, Sep. 23, 2004, pp. 1987-1990.

Jensen et al., "Role of Surface Diffusion in Chemical Beam Epitaxy of InAs Nanowires", *Nano Letters*, vol. 4, No. 10, Sep. 14, 2004, pp. 1961-1964.

Baluch et al., "Atomic-level robustness of the Si(100)-2x1: H surface following liquid phase chemical treatments in atmospheric pressure environments," J. Vac. Sci. Technol., A, May/Jun. 2004, 22(3):L1-L5.

Buriak et al., "Organometallic Chemistry on Silicon and Germanium Surfaces," Chemical Reviews, 2002, 102(5):1272-1308.

Endo et al., "Atomic image of hydrogen-terminated Si(001) surfaces after wet cleaning and its first-principles study," J. Appl. Physics, Apr. 1, 2002, 91(7):4065-4072.

Weldon et al., "The surface science of semiconductor processing: gate oxides in the ever-shrinking transistor," Surface science, 2002, 500:859-878.

\* cited by examiner

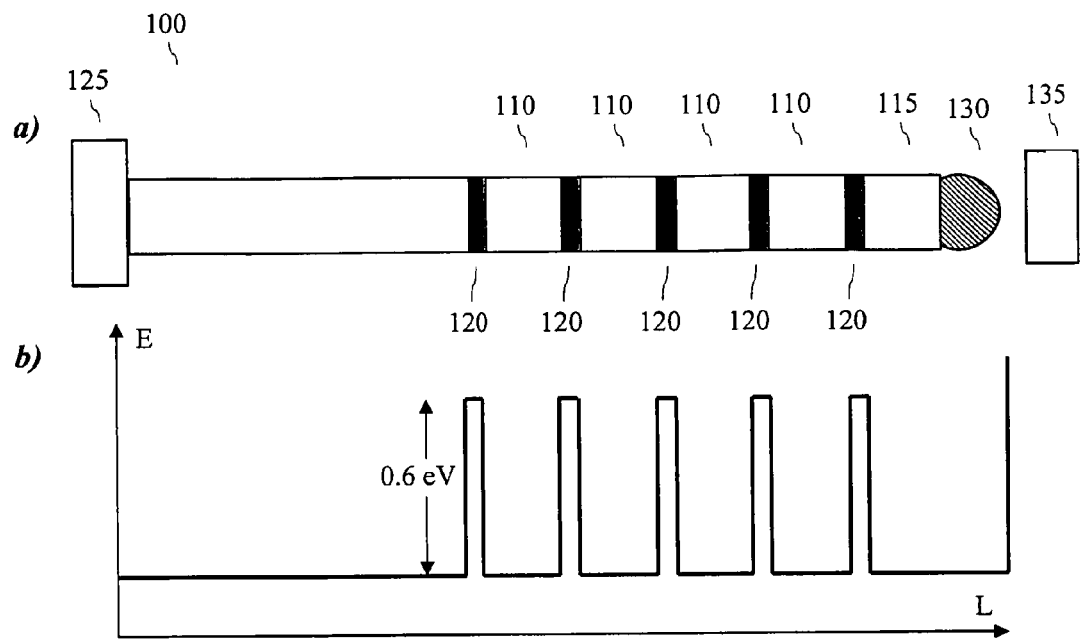
*Fig. 1a-b*
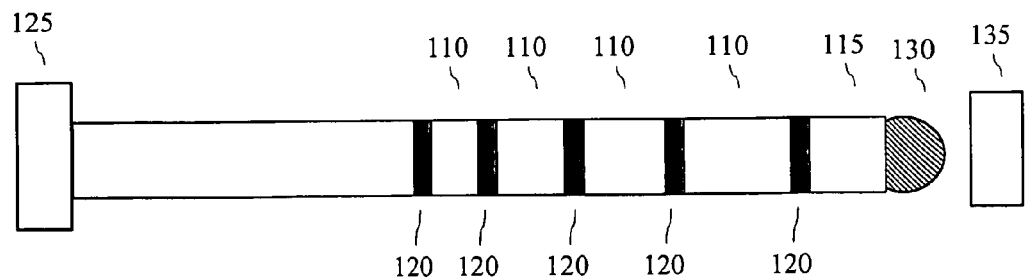
*Fig. 2* a)
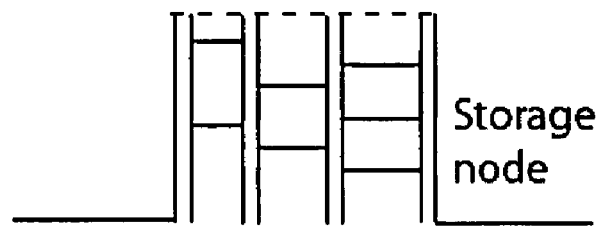
Storage node
b)
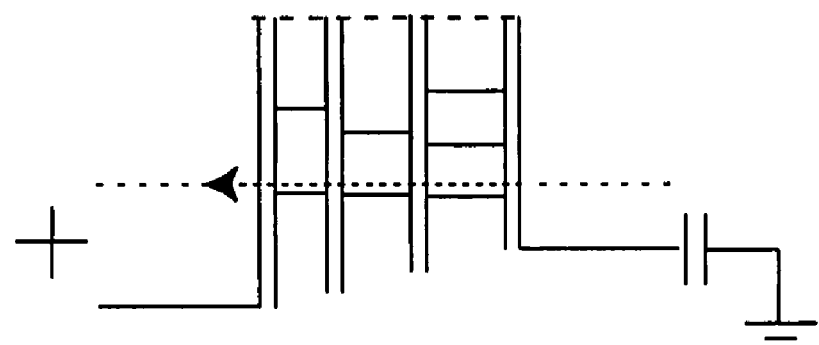
c)
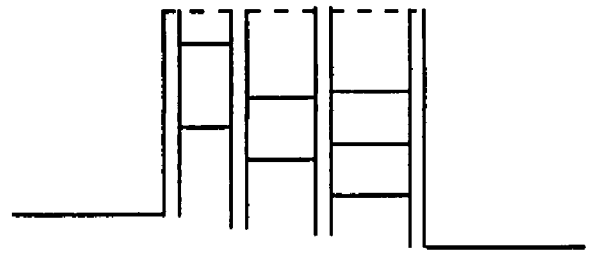
*Fig. 3a-c*

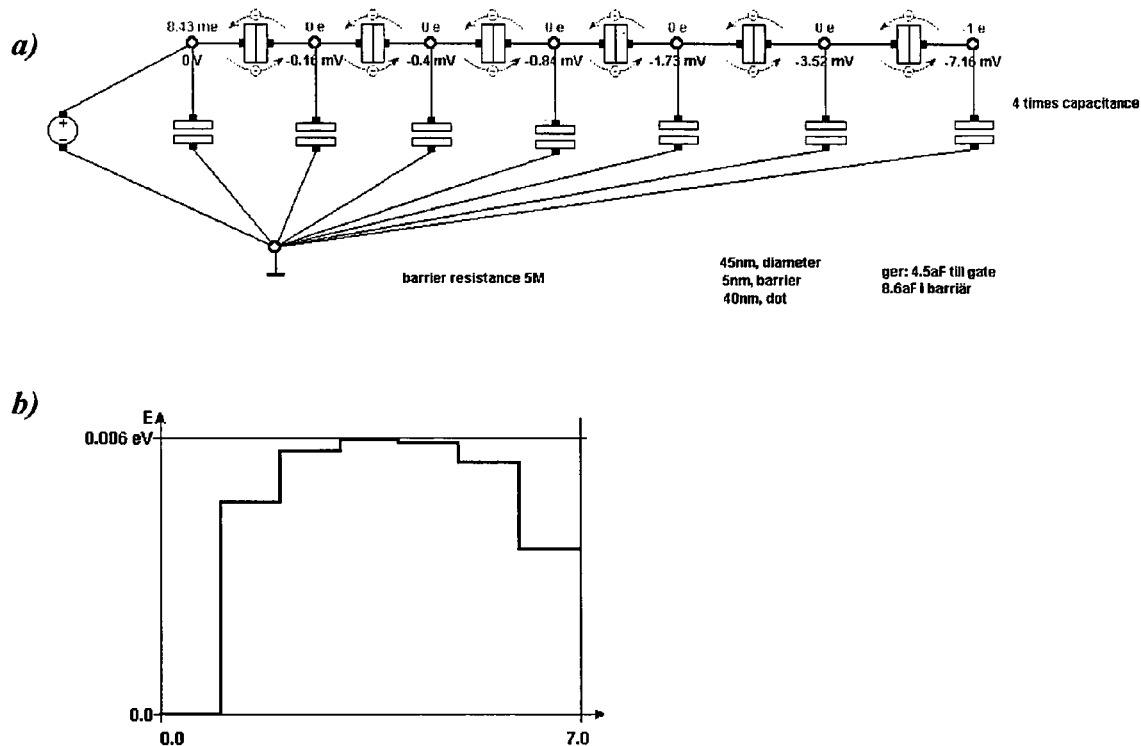
*Fig. 4a-b*

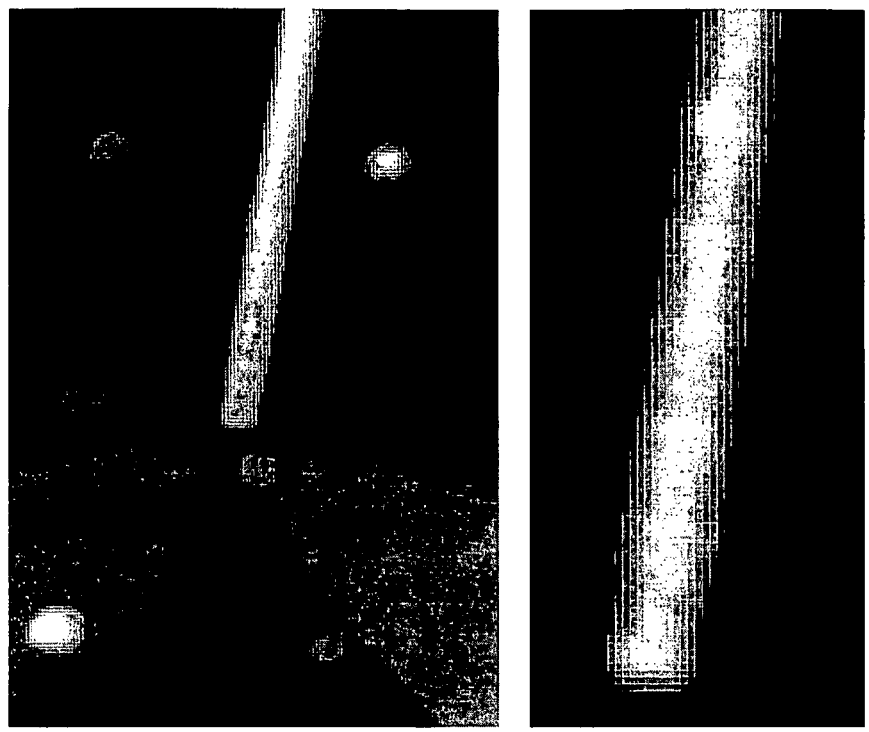
Fig. 7  Fig. 8
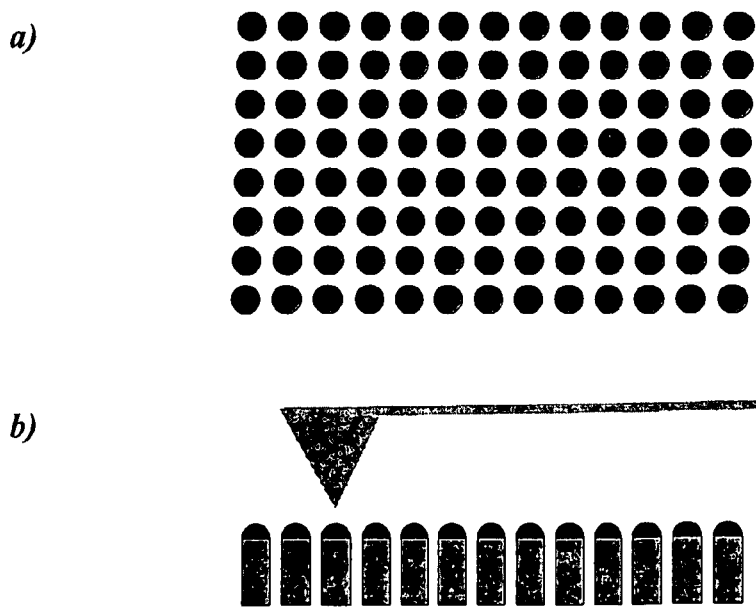
Fig. 9a-b

DATA STORAGE NANOSTRUCTURES

FIELD OF THE INVENTION

The present invention relates to a device for data storage. In particular the invention relates to a single electron memory device utilizing multiple tunnel junctions, and arrays or matrixes of such devices.

BACKGROUND OF THE INVENTION

The interest in single electron device, and in particular single electron memories, has over the last couple of years shown an significant increase.

The interest, for the data storage applications, arising primarily from the seemingly ever increasing demand for faster and more densely packed memories in combination with recent reports indicating that such memories are technologically achievable. Compared to the today most used nonvolative memories for handheld devices, flash memories, memories based on single-electron devices have the potential of offering extremely dense memories since the devices are of nanoscale dimensions. Another advantage is very low power consumption due to the fact that only a very limited number of electrons are involved in the basic operations, which also can give very fast operation. The term "single electron memory" is somewhat misleading in that more than one electron may be used for representing a state (bit), although involving order of magnitudes less electrons than conventional memories. Hereinafter the term "single electron memory" should be interpreted as also comprising devices wherein a plurality, but a comparable small number, of electrons are used to represent a state. Alternatively, which also is encompassed by the term "single electron memories", the absence of electrons, i.e. positive charge, is used for the representation. A small number in this context is below thousands of electrons/charges.

The realization of single electron devices has become possible through the advances in nanotechnology techniques and processes now providing structures that range in size from small devices of atomic dimensions, to much larger scale structures for example on the microscopic scale.

Commonly, such structures include "nanostructures". In certain contexts nanostructures are considered to be those having at least two dimensions not greater than about 100 nm. Ordinarily, layered structures or stock materials having one or more layers with a thickness less than 1 µm are not considered to be nanostructures. Nanostructures include one-dimensional nanoelements, essentially in one-dimensional form, that are of nanometer dimensions in their width or diameter, and that are commonly known as nanowhiskers, nanorods, nanowires, nanotubes, etc.

In regard to data storage, there have been proposals, and devices constructed, operating on the principle of storage of a single electron in an array of conductive islands separated by tunnel barriers, referred to as multiple tunnel junction (MJT) memories. The basic principle, to be exploited for the memory functionality, is that charge that is introduced to the structure by applying a voltage, can be confined to one part of the memory structure for en extended time, due to the tunnel barriers giving an energy barrier and thus a metastable state is formed. The presence of the charge, which can be detected by for example a field effect transistor, may represent a state(bit). A comprehensive overview is given in section 3.4 "Single Electron Trap" of Chapter II "Electronics below 10 nm", Likharev pp. 27-68 of "Nano and Giga challenges in nano-electronics", Greer etal (Elsevier 2003). Implementations of such structures are disclosed in for example: Dutta et al, APL vol. 75, no. 10 6 Sep. 1999, pp. 1422-1424 "Silicon-based single electron memory using a multiple-tunnel junction fabricated by electron-beam direct writing"; Stone et al, APL vol. 73 no. 15, 12 Oct. 1998, pp. 2134-2136 "Silicon single electron memory cell".

Prior art MJT memories typically exhibit small energy barriers, resulting in poor memory function at temperatures above the cryogenic. This is particularly pronounced in MJT memories using metallic islands, wherein the barriers can be only a few meV. Another drawback with the prior art single electron memory structures is that the structures extends in the horizontal direction of the substrate wafer. Together with electrodes connecting to the MJTs the assemblies extension may be substantial and hinder the dense packing expected from the use nanostructures. A further drawback relates to technological problem to fabricate in a reproducible way a single electron memory device having a sufficient number of tunnel barriers for reliable data storage, where the device should have as low stray capacitances as possible.

U.S. Pat. No. 6,126,654 and Likharev et al, APL 73, 15 12 Oct. 1998 pp. 2137-9 "Layered tunnel barriers for nonvolatile memory devices" disclose a read/write head for scanning a two-dimensional array of nanometer sized particles, small groups of such particles forming individual storage devices.

SUMMARY OF THE INVENTION

Obviously the prior art single electron devices needs significant improvements in order to fulfil the anticipated advantages, as regards to reproducibility, scalability, and performance at non cryogenic temperatures.

The object of the present invention is to provide a nano-structured data storage device that overcomes the drawbacks of the prior art devices. This is achieved by the data storage device as defined in claim 1.

The data storage device according to the invention comprises at least one nanowhisker adapted to store a charge. Each of the nanowhiskers comprises a sequence of axial segments of materials of different band gaps, arranged to provide a sequence of conductive islands separated by tunnel barriers and a storage island arranged at one end of the conductive island/tunnel barrier sequence, whereby to provide a data storage capability. The number of conductive islands should preferably be between five and ten. A number above four is needed in order to achieve a sufficient retention effect of the store charge. The improvements of adding an extra conductive island/barrier—pair if above ten is probably neglectable.

According to one embodiment of the present invention the conductive islands are of varying size. This gives a possibility to misaligned the energy levels associated with each conductive island, which may improve the memory retention effect. The ordering of the sizes of the conductive islands is dependent on whether the nanowhisker is adapted for use of negative or positive bias voltage for the writing procedure.

According to the invention a data storage device is provided wherein the nanowhiskers are aligned parallel with respect to their axial direction and with their storage islands essentially defining a plane. The nanowhiskers may be arranged in an array or in a matrix. Whereby a memory with very high density can be provided.

More specifically the data storage device according to the invention comprises at least one nanowhisker coupled to input contacts or terminals, each said nanowhisker comprising: a column with a diameter of nanometer dimension, the column including along its length a sequence of lengthwise segments of a first material forming conductive islands, the first segments being separated from each other by second lengthwise segments of a second material forming tunnel barriers between the conducting islands. The first and second crystalline materials, should according to the invention, be chosen so that the first material (conducting islands) has a small band gap compared to the second material (barrier). The second material may in fact has such a large band gap that it is essentially an insulator. The first and second materials should be chosen so that it is possible to combine them epitaxially. In the case of the conducting islands are given such dimension that they essentially act as quantum dots, it may be advantageous to use a first material with a slightly larger band gap than for the case with larger conducting islands. This is to avoid that the quantum dot becomes an insulator.

The composition boundary between the first and second materials may be an atomically sharp heterojunctions (less than 5 lattice planes), or an atomically abrupt heterojunction, extending over an axial interval of not more than 1-3 diametral lattice planes. Preferably, the composition boundary between the crystalline materials of the first and second segments extends over an axial interval of not more than 8 diametral lattice planes.

Thanks to the invention it is possible to reproducibly produce nanostructured data storage devices, whereby fully exploiting the anticipated advantages of offering extremely dense memories since the devices are of nanoscale dimensions, very low power consumption, and very fast operation.

One advantage of the data storage device according to the invention is that the number and size of the conductive islands easily can be adapted to the requirements.

A further advantage of the invention is that a wide range of materials can be used for the conductive islands and the tunnel barriers.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein:

FIG. 1a schematically illustrates a nanowhisker in accordance with the invention having a sequence of conductive islands, separated by tunnel barriers, and FIG. 1b a corresponding conduction band energy level diagram;

FIG. 2 schematically illustrates a nanowhisker in accordance with one embodiment of the invention having conductive islands of varying size;

FIG. 3a-c schematically illustrates the energy levels in an unbiased and uncharged system (a), a biased system (b) and a charged but unbiased system (c);

FIG. 4a shows a circuit diagram for the nanowhisker of FIG. 1, when electrically connected for data storage, and FIG. 4b a graph showing the energy of a single electron in the respecitive islands of the nanowhisker;

FIG. 7 is an image of a nanowhisker, similar to that of FIG. 1, positioned on a substrate, with a single electron transistor formed adjacent the catalytic particle at the end of the nanowhisker;

FIG. 8 is an enlarged view of the nanowhisker of FIG. 7; and

FIGS. 9a and 9b are schematic views of an array of nanowhiskers, each as shown in FIG. 1, forming a data storage array, together with a scanning head.

DETAILED DESCRIPTION

Figure 5:
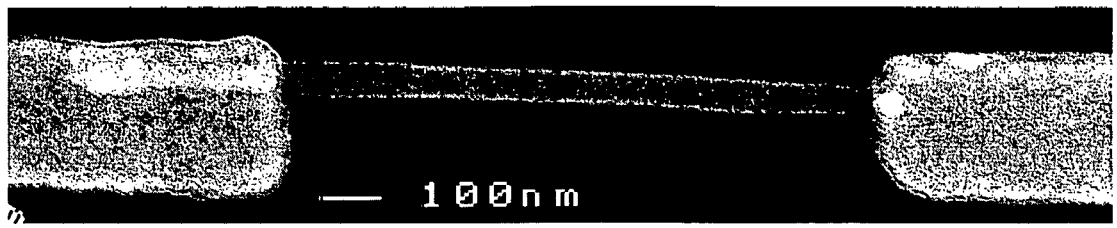
FIG. 5 shows an image of a nanowhisker, similar to that of FIG. 1, connected between input and out terminals;.

Multi-tunnel junctions are of interest for memories as they can be used to store electrons. The major technological problem is, as described in the background section, to fabricate a sufficient number of tunnel barriers in a reproducible way, where the device should have as low stray capacitances as possible. According to the present invention a single electron memory device is provided comprising of at least one heterostructured nanowhisker as the charge storing component. Each nanowhisker comprises a sequence of axial segments of materials of different band gaps, whereby to provide a sequence of conductive islands separated by tunnel barriers, whereby to provide a data storage capability. A memory assembly according to the invention is formed by a plurality of vertically standing nanowhiskers, i.e. the base ends of the nanowhisker essentially defining one plane and the top ends defining a second plane elevated above the first plane. Thus a very dense packing of the nanowhisker is achieved allowing for an extremely compact memory assembly. In accordance with copending application, U.S. Ser. No. 10/751,944 to Samuelson et al, the contents of which are incorporated herein by reference, very accurately ordered arrays or matrixes of nanowhiskers may be constructed.

It should be understood that although the device is referred to as a single electron memory, a positive charge can equally well be used as the information indication. In the following, then the nanowhisker memory according to the invention, or its operation, is exemplified with an electron(s) it should be recognized that equivalent results are obtained with a positive charge(s) taking appropriate and obvious measures.

As regards "nanowhiskers", the basic process of microscopic whisker formation on substrates, by the so-called VLS (vapor-liquid-solid) mechanism, is well known. A particle of a catalytic material, usually gold, for example, on a substrate is heated in the presence of certain gases to form a melt. A pillar forms under the melt, and the melt rises up on top of the pillar. The result is a whisker of a desired material with the solidified particle melt positioned on top. (See E. I Givargizov, Current Topics in Materials Science, Vol. 1, pages 79-145, North Holland Publishing Company, 1978.) The dimensions of such whiskers were in the micrometer range.

International Application Publication No. WO 01/84238 discloses in FIGS. 15 and 16 a method of forming nanowhiskers wherein nanometer sized particles from an aerosol are deposited on a substrate and these particles are used as seeds to create nanowhiskers, and other one-dimensional nanoelements.

Although the growth of nanowhiskers catalyzed by the presence of a catalytic particle at the tip of the growing whisker has conventionally been referred to as the VLS (Vapor-Liquid-Solid process), it has come to be recognized that the catalytic particle may not have to be in the liquid state to function as an effective catalyst for whisker growth. At least some evidence suggests that material for forming the whisker can reach the particle-whisker interface and contribute to the growing whisker even if the catalytic particle is at a temperature below its melting point and presumably in the solid state. Under such conditions, the growth material, e.g., atoms that are added to the tip of the whisker as it grows, may be able to diffuse through a the body of a solid catalytic particle or may even diffuse along the surface of the solid catalytic particle to the growing tip of the whisker at the growing temperature. Evidently, the overall effect is the same, i.e., elongation of the whisker catalyzed by the catalytic particle, whatever the exact mechanism may be under particular circumstances of temperature, catalytic particle composition, intended composition of the whisker, or other conditions relevant to whisker growth. For purposes of this application, the term "VLS process", or "VLS mechanism", or equivalent terminology, is intended to include all such catalyzed procedures wherein nanowhisker growth is catalyzed by a particle, liquid or solid, in contact with the growing tip of the nanowhisker.

For the purposes of this specification the term nanowhiskers is intended to mean one-dimensional nanoelements with a width or diameter (or, generally, a cross-dimension) of nanometer size. Nanowhiskers may for example be formed by the so-called VLS mechanism. Nanowhiskers are also referred to in the art as "nanowires" or, in context, simply as "wires", and such terminology, as used in this application, is equivalent to the term "nanowhiskers".

Several experimental studies on the growth of nanowhiskers have been made. Hiruma et al. grew III-V nanowhiskers on III-V substrates in a metal organic chemical vapor deposition (MOCVD) growth system. (See K. Hiruma, et al., J. Appl. Phys. 74, page 3162 (1993); K. Hiruma, et al., J. Appl. Phys. 77, page 447 (1995); K. Hiruma, et al., IEICE Trans. Electron. E77C, page 1420 (1994); K. Hiruma, et al., J. Crystal Growth 163, pages 226-231 (1996)).

In prior U.S. patent application Ser. No. 10/613,071, published as No. 2004-0075464, to Samuelson et al, and International patent application WO-A-04/004927 (both of which and their underlying applications are incorporated herein by reference), there are disclosed nanowhiskers having segments of different materials, with abrupt or sharp heterojunctions therebetween in various configurations to form nanostructures of different types.

Using the teaching of Samuelson et al, it is in accordance with the present invention, possible to provide a nanowhisker with a diameter of nanometer dimension, the nanowhisker including along its length a sequence of at least three first lengthwise segments of a first crystalline material forming conductive islands, the first segments being separated from each other by second lengthwise segments of a second crystalline material forming tunnel barriers between the conductive conductive islands. The composition boundary between the first and second materials may be an atomically sharp heterojunctions (less than 5 lattice planes), or an atomically abrupt heterojunction, extending over an axial interval of not more than 1-3 diametral lattice planes. The overall width of the tunnel barriers is a significant parameter, since the addition of only a single monolayer may significantly affect attenuation of a single electron wave by as much as a factor of one half. In addition the size of the islands is a significant parameter. Generally, in accordance with the invention, very precise control may be exerted over the physical dimensions of the islands and tunnel barriers, to within a single lattice plane if necessary.

The first and second crystalline materials, should according to the invention, be chosen so that the first material (conducting islands) has a small band gap compared to the second material (barrier). The second material may in fact has such a large band gap that it is essentially an insulator. The first and second materials should be chosen so that it is possible to combine them epitaxially.

In the case of the conducting islands are given such dimension that they essentially act as quantum dots, it may be advantageous to use a first material with a slightly larger band gap than for the case with larger conducting islands. This is to avoid that the quantum dot becomes an insulator.

According to one embodiment of the invention the conducting islands are of such dimensions that they act as quantum dots (0D segments).

The controlled inclusion of heterostructures in nanowhiskers, as a way to create an arbitrary number of electrically connected 0D segments in a natural 1D structure for the purpose of producing a memory device, makes it possible to overcome the drawbacks of the methods described and/or demonstrated previously.

By increasing the number of tunnel junctions, higher order tunneling events are prohibited (e.g. so called co-tunneling), which at low temperatures is the completely dominating process for discharge of the memory. Also the width of the tunnel barriers can be increased to have a larger resistance of the structure, which dramatically reduces higher order tunneling, but at the cost for lower writing speeds. At higher temperatures it may be advantageous to have small capacitances of the islands between the tunnel junctions in order to increase the charging energy. This is done by reducing the size of the structure.

By taking advantage of the reduced need for atomic lattice matching materials with big offset in band gap can be epitaxially combined. Larger band gaps are necessary for non cryogenic uses.

Read-out of the memory is done by analyzing the electric field close to the storage node. This can be done in different ways: A single-electron transistor (SET) is extremely sensitive to electric charges in its vicinity. This uses a current of one-electron at a time passing through a small conducting grain. The drawback with SETs is that they generally only work at quite low temperatures. A field-effect transistor on the other hand operates also at room-temperature and can be used for read-out, but with reduced sensitivity.

Referring to the drawings, FIG. 1a schematically illustrating a nanowhisker 100 in accordance with the invention comprising a plurality heterostructure segments. The nanowhisker comprises of base part 105, a plurality of conducting islands 110 and a storage island (node) 115, all of a conducting, or semiconducting material. The conducting islands 110 are separated by tunnel barriers 120 of a second material. A base contact 125 is connected to the base part 105. The metal (gold) particle, remaining from the production process of the nanowhisker, may serve as a top contact 130 in the top end. Alternatively the metal particle is etched away and replaced with another contact. A second top end contact 135 is arranged to capacitively couple to the top end contact 130.

FIG. 1b schematically illustrates the conduction band structure characteristic of the nanowhisker of FIG. 1a.

According to one embodiment of the invention the conducting islands 110 are formed by axial segments of InP, and the tunnel barriers 120 by axial segments of InAs that have a conduction band differential of 0.6 eV, thus forming tunnel barriers. The dimensions of the nanowire, the size of the islands, and the number of islands are parameters that need to be considered and adjusted depending on the materials and the intended use of the memory device. In the case of InAs a suitable diameter of the nanowhisker is 20-40 nm. The conducting islands 110, in this case forming quantum dots, should be in order of 5-10 nm, and the number of island in the range of 5-10. At least 4 tunnel barriers are needed to achieve the desired memory retention effect. At around 10 barriers the added effect of adding another barrier is probably minimal. The barrier thickness, i.e. the thickness of the InP inclusions should preferably be in the order of 2-3 nm.

The storage island 115 should ideally be a bit larger than the other islands, which means that the capacitance to a nearby ground electrode is larger, leading to an efficient trapping of electrons.

The relatively low barrier height of 0.6 eV for the InAs/InP-combination may not be appropriate in all circumstances, but this barrier height may be increased by using other materials combinations within the nanowires. One way of increasing the band gap is to keep InAs as the low-bandgap material since it has many attractive properties, and introducing aluminium as a group III material in the barrier to increase the band gap, for example in the form of an oxide or compound such as $Al_2O_3$, AlGaP or AlGaAs. Aluminium can be introduced also in structures of other materials than InAs. Another approach would be to use Ge—Si superlattices and oxidize Si to form tunnel barriers.

The nanowhisker of FIG. 1 has been illustrated with equally spaced tunnel barriers 120, giving the same size of the conducting islands (quantum dots) 110. In an further embodiment, schematically illustrated in FIG. 2, the nanowhisker of the invention is provided with conducting islands 110 of varying size. This will lead to varying and misaligned energy levels in an unbiased system, which may increase the retention properties of the structure. In the figure, the sizes of the conductive islands 110 are graded with smaller dots near the base part 105 and larger dots near the storage island 115, which is preferred in the case wherein a positive bias is applied to the base contact 125 in order to enable storing. In the case of a negative bias on the base contact 125, the order of the sizes of the conductive islands should be reversed.

In the basic operation using the nanowhisker memory according to the present invention, as illustrated in FIG. 2, schematically illustrated in FIG. 3a-c, a charge is introduced to the structure and remains at the storage island in a metastable state. FIG. 3a illustrates the band structure of an uncharged and unbiased system. The process comprises the principle steps of:

1. A positive bias is applied to the base contact 125 of the nanowhisker 100 (FIG. 3b). At high enough bias voltage, energy levels are aligned in the system. It is then possible for charge to leave the storage node, and it becomes positively charged. As described above, if a negative bias voltage is used, the grading of the sizes of the conducting island should be inversed, and the storage island negatively charged.
2. The charge(s) are stored in a meta-stable state (FIG. 3c). Until the system has been reversed biased (disregarding voltage offsets) the charge is retained. The memory can however be spontaneously erased by radiation, high temperature and higher order tunnelling processes.
3. Readout is carried out with a device sensitive to nearby charge. For single-electron storage, either single-electron transistor read-out, or quantum-point contact read-out is appropriate. For multiple electron storage, field-effect transistor read-out is feasible. Readout is in this case carried out by placing a semiconductor channel close to the storage node. With an n-type transistor, a high transistor current means that the memory has been positively charged, and a low transistor current that the node is un-charged, or negatively charged.
4. The memory is erased by applying a reversed bias, as regard to the charging bias of step 1. (disregarding voltage offsets).

FIG. 4a-b shows simulations for the energy of an electron moved towards the storage island in a multi-tunnel junction system (6 islands). The capacitances have been obtained from measurements on individual dots in nanowires. The simulations shown have been carried out using SIMON (simulation of nanostructures, Cristoph Wasshuber). A 6-island configuration has been used as illustrated in FIG. 4a, where the indicated capacitances have been obtained from real devices. In the simulation an electron is forced towards the storage node to the right, and the diagram of FIG. 4b shows the energy required to do this. Note that the electron gains energy after passing through half of the structure, which means that the electron can be stored. The simulation referrer to a metal systems, but the general behaviour is the same in semiconducting systems. A semiconducting system of dimensions such that the conducting islands form quantum dots, the energy barriers are expected to be higher due to the strong quantum confinement.

Figure 6:
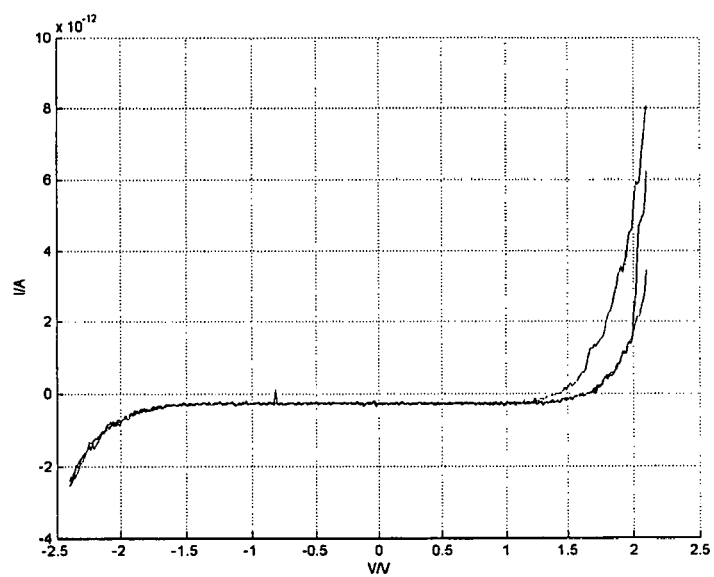
FIG. 6 is a graph of the current-voltage characteristics for the nanowhisker of FIG. 5.

FIG. 5 shows an image of a nanowhisker, similar to that of FIG. 1, connected between input and out terminals. The nanowhisker has a built-in heterostructure section at its right end (5 islands). FIG. 6 comprises a 2-terminal I-V measurement of the above nanowhisker. This shows that current starts to flow in the structure when a bias voltage of around 1 V is applied. An electrical coupling is provided to the storage node. Alternatively, a capacitive coupling to the storage node may be provided. A voltage of around 1 V needs to be applied, in the exemplifying system, to have transport of electrons through the nanowhisker.

FIG. 7 is an image of a nanowhisker, similar to that of FIG. 1, positioned on a substrate, with a single electron transistor formed adjacent the catalytic particle at the end of the nanowhisker. Discharging of the storage node provided by the catalytic particle affects the conductance of the SET. In the fabrication of the electrodes to the SET, As has evaporated from the InAs, causing the InP tunnel barriers to become visible, see FIG. 8.

Referring now to FIGS. 9a and 9b, an ordered array or matrix of storage points, each comprising a nanowhisker, is formed by the techniques disclosed and claimed in copending application, U.S. Ser. No. 10/751,944 to Samuelson et al, filed Jan. 7, 2004, the contents of which are incorporated herein by reference. High-density ordered arrays of nanowhiskers according to the invention may be formed, either in a honeycomb-lattice structure or in a quadratic lattice, thus exposing, at a high-density, the storage points to be read-out by e.g. a scanning-probe head. The storage density may be estimated of up to 1 Tb/cm2 (corresponding to a storage node of 10 nm×10 nm). The possibility to use only the energy corresponding to storing these nodes by 1-5 electrons is an added attractive feature.

A probe head is provided for scanning over the array, and selectively positioning over each storage point, the probe head for example comprising an AFM tip. The tip may be formed with an integral nanowhisker, as disclosed and claimed in copending U.S. application Ser. No. 10/751,943 filed Jan. 7, 2004, to Samuelson etal, the contents of which are incorporated herein by reference.

Electrons will be stored in the gold particles at the end of each nanowhisker; alternatively the gold particles would be etched away. One would then use a scanning SET, incorporated in the probe head to read out and write the storage nodes with charges.

While the invention has been described in connection with what is presently considered to be the most practical and preferred embodiments, it is to be understood that the invention is not to be limited to the disclosed embodiments, on the contrary, is intended to cover various modifications and equivalent arrangements within the appended claims.

The invention claimed is:

1. A data storage device, comprising at least one nanowhisker adapted to store a charge, each said nanowhisker comprising: a sequence of axial segments of materials of different band gaps, arranged to provide a sequence of conductive islands separated by tunnel barriers; and
   a storage island arranged at one end of the conductive island/tunnel barrier sequence, whereby to provide a data storage capability, wherein said nanowhisker is coupled with an input contact or terminal that provides a bias voltage that changes a charge in the storage island, wherein:
   (a) said at least one nanowhisker is an array or matrix of said nanowhiskers, the nanowhiskers of said array or matrix are aligned parallel with respect to their axial direction and with their storage islands essentially defining a plane;
   (b) the conductive islands are formed of a first crystalline material, and the tunnel barriers are formed of a second crystalline material, and the band gap of the first material is smaller than the band gap of the second material; and
   (c) the device further comprises a scanning probe head configured to scan over the array or matrix and selectively position over a storage island of each of the nanowhiskers of the array or matrix.

2. The data storage device according to claim 1, wherein the second material is possible to combine epitaxially with the first material.

3. The data storage device according to claim 2, wherein the second material is an insulator.

4. The data storage device according to claim 1, wherein the nanowhisker comprises between five and ten of said conductive islands.

5. The data storage device according to claim 4, wherein said conductive islands are of essentially the same size.

6. The data storage device according to claim 4, wherein said conductive islands are of varying size.

7. The data storage device according to claim 6, wherein said conductive islands are of varying size with larger conductive islands close to the storage island and smaller close to the other end of the nanowhisker, whereby adapting the nanowhisker memory for having a positive bias voltage applied to the other end of the nanowhisker.

8. The data storage device according to claim 6, wherein said conductive islands are of varying size with smaller conductive islands close to the storage island and larger close to the other end of the nanowhisker, whereby adapting the nanowhisker memory for having a negative bias voltage applied to the other end of the nanowhisker.

9. The device of claim 1, wherein the nanowhisker is electrically coupled with the contact or terminal.

10. The device of claim 1, wherein the nanowhisker is capacitively coupled with the contact or terminal.

11. The device of claim 1, further comprising a readout device sensitive to the charge in the storage island.

12. The device of claim 11, wherein said readout device is a single electron transistor readout, a quantum-point contact readout or a field-effect transistor read-out.

* * * * *